(12) United States Patent
Askebjer et al.

(10) Patent No.: US 10,149,390 B2
(45) Date of Patent: Dec. 4, 2018

(54) MASKLESS WRITING OF A WORKPIECE USING A PLURALITY OF EXPOSURES HAVING DIFFERENT FOCAL PLANES USING MULTIPLE DMDS

(71) Applicant: Micronic Mydata AB, Taby (SE)

(72) Inventors: Per Askebjer, Akersberga (SE); Mats Rosling, Taby (SE)

(73) Assignee: Mycronic AB, Taby (SE)

( * ) Notice: Subject to any disclaimer, the term of this patent is extended or adjusted under 35 U.S.C. 154(b) by 212 days.

(21) Appl. No.: 14/011,725

(22) Filed: Aug. 27, 2013

(65) Prior Publication Data

US 2014/0053399 A1    Feb. 27, 2014

Related U.S. Application Data

(60) Provisional application No. 61/693,716, filed on Aug. 27, 2012, provisional application No. 61/696,135, (Continued)

(51) Int. Cl.
   *H05K 3/00* (2006.01)
   *G03F 7/20* (2006.01)

(52) U.S. Cl.
   CPC ......... *H05K 3/0017* (2013.01); *G03F 7/2022* (2013.01); *G03F 7/70333* (2013.01); (Continued)

(58) Field of Classification Search
   CPC ..... G06T 2207/30141; Y10T 29/49155; Y10T 29/49124; H05K 3/0082; H05K 3/0002; (Continued)

(56) References Cited

U.S. PATENT DOCUMENTS 4,088,864 A * 5/1978 Theeuwes ............ A61J 3/10
                                              206/0.5
4,789,770 A * 12/1988 Kasner ............... B23K 26/03
                                              219/121.7
(Continued)

FOREIGN PATENT DOCUMENTS

EP    1426190 A1    6/2004
EP    1653280 A1    5/2006
(Continued)

OTHER PUBLICATIONS

Prashant, M., et al., "Next Generation eWLB (embedded Wafer Level BGA) Packaging," Singapore, Copyright 2010, Electronics Packaging Technology Conference Proceedings, IEEE, pp. 1-8.
(Continued)

*Primary Examiner* — Peter DungBa Vo
*Assistant Examiner* — Kaying Kue
(74) *Attorney, Agent, or Firm* — Haynes Beffel & Wolfeld LLP; Ernest J. Beffel, Jr.; Andrew L. Dunlap

(57) ABSTRACT

The technology disclosed relates to accommodating embedded substrates during direct writing onto a printed circuit board and to other patterning problems that benefit from an extended depth of focus. In particular, it relates to multi-focus direct writing of a workpiece by the continuous or step-wise movement of the workpiece during the sequence of exposures having different focus planes. In one implementation, a multi-arm rotating direct writer is configured for interleaved writing focused on two or more focal planes that generally correspond to two or more surface heights of a radiation sensitive layer that overlays the uneven workpiece. Alternating arms can produce interleaved writing to the two or more focal planes.

15 Claims, 10 Drawing Sheets

Related U.S. Application Data filed on Sep. 1, 2012, provisional application No. 61/696,152, filed on Sep. 1, 2012.

(52) U.S. Cl.
CPC ....... *G03F 7/70383* (2013.01); *H05K 3/0082* (2013.01); *H05K 2203/108* (2013.01); *Y10T 29/49155* (2015.01)

(58) Field of Classification Search
CPC ........ H05K 3/40; H05K 3/0017; G03F 7/704; G03F 7/70641; G03F 7/70383; G03F 7/70333; G03F 7/2022
USPC ........... 29/829, 825, 846–853; 430/311, 396, 430/312, 296, 397; 250/492.3; 347/255, 347/256; 382/145
See application file for complete search history.

(56) References Cited

U.S. PATENT DOCUMENTS

| | | | |
|---|---|---|---|
| 4,886,958 A * | 12/1989 | Merryman | G02B 26/10 250/201.4 |
| 4,937,619 A | 6/1990 | Fukuda et al. | |
| 5,063,280 A * | 11/1991 | Inagawa | B23K 26/032 219/121.7 |
| 5,099,090 A * | 3/1992 | Allan | H01B 1/22 106/31.92 |
| RE33,931 E | 5/1992 | Whitney | |
| 5,156,772 A * | 10/1992 | Allan | H01B 1/22 252/512 |
| 5,592,211 A * | 1/1997 | Porter | G02B 26/10 347/255 |
| 5,652,645 A * | 7/1997 | Jain | G03F 7/2002 355/50 |
| 5,666,722 A * | 9/1997 | Tamm | B23K 26/04 29/833 |
| 5,868,950 A * | 2/1999 | Noddin | H01L 21/486 216/18 |
| 6,133,986 A | 10/2000 | Johnson | |
| 6,222,157 B1 * | 4/2001 | Langille | B23K 26/0823 219/121.69 |
| 6,251,550 B1 * | 6/2001 | Ishikawa | G03F 7/2051 430/22 |
| 6,285,488 B1 * | 9/2001 | Sandstrom | B23K 26/032 250/492.1 |
| 6,312,134 B1 * | 11/2001 | Jain | G03F 7/70291 355/35 |
| 6,379,867 B1 * | 4/2002 | Mei | G03F 7/70275 355/53 |
| 6,407,363 B2 * | 6/2002 | Dunsky | B23K 26/02 219/121.69 |
| 6,657,159 B2 * | 12/2003 | McKee | B23K 26/0604 219/121.71 |
| 6,764,796 B2 * | 7/2004 | Fries | G03F 7/2002 250/492.1 |
| 6,864,459 B2 * | 3/2005 | Chang | B23K 26/0075 219/121.71 |
| 6,897,941 B2 | 5/2005 | Almogy | |
| 6,998,219 B2 * | 2/2006 | Fries | G03F 7/0041 428/457 |
| 7,046,266 B1 * | 5/2006 | Retschke | G03F 7/203 347/239 |
| 7,084,411 B2 | 8/2006 | Lammer-Pachlinger et al. | |
| 7,123,417 B2 | 10/2006 | Ishikawa et al. | |
| 7,230,677 B2 | 6/2007 | Baselmans et al. | |
| 7,501,696 B2 | 3/2009 | Koyama et al. | |
| 7,672,112 B2 | 3/2010 | Hattori et al. | |
| 7,771,803 B2 * | 8/2010 | Daniel | B81B 3/0059 428/17 |
| 7,839,484 B2 | 11/2010 | Yamaguchi et al. | |
| 7,923,182 B2 | 4/2011 | Sandstrom et al. | |
| 7,939,484 B1 | 5/2011 | Loeffler et al. | |
| 8,351,020 B2 | 1/2013 | Sandstrom | |
| 8,481,887 B2 * | 7/2013 | Alpay | B23K 26/0869 219/121.69 |
| 9,202,742 B1 * | 12/2015 | Kim | H01L 23/49827 |
| 2001/0010536 A1 * | 8/2001 | Katzir | G03F 7/70041 347/255 |
| 2002/0141024 A1 * | 10/2002 | Retschke | B41J 2/471 359/196.1 |
| 2002/0190037 A1 * | 12/2002 | Steur | H05K 3/0038 219/121.71 |
| 2003/0210383 A1 | 11/2003 | Bjorklund et al. | |
| 2004/0004699 A1 | 1/2004 | Kanatake | |
| 2004/0195730 A1 * | 10/2004 | van Weperen | B26F 1/26 264/400 |
| 2006/0123381 A1 * | 6/2006 | Nakamura | G03F 1/68 716/53 |
| 2007/0144769 A1 * | 6/2007 | Salama | H01L 21/486 174/260 |
| 2007/0148420 A1 * | 6/2007 | Salama | H05K 3/185 428/209 |
| 2009/0242528 A1 * | 10/2009 | Howerton | B23K 26/38 219/121.71 |
| 2010/0012743 A1 | 1/2010 | Nakazono et al. | |
| 2010/0014063 A1 | 1/2010 | Sumi et al. | |
| 2010/0142757 A1 | 6/2010 | Sandstrom et al. | |
| 2010/0229146 A1 | 9/2010 | Lindau et al. | |
| 2011/0213479 A1 | 9/2011 | Wahlsten et al. | |
| 2012/0007254 A1 * | 1/2012 | Yang | H01L 23/4985 257/774 |
| 2012/0129359 A1 * | 5/2012 | Shimoi | B23K 26/0057 438/795 |
| 2016/0158886 A1 * | 6/2016 | Kumar | B23K 26/006 219/121.61 |

FOREIGN PATENT DOCUMENTS

| | | |
|---|---|---|
| JP | 2011007941 A | 1/2011 |
| WO | 2005029178 A2 | 3/2005 |
| WO | 2007013676 A1 | 2/2007 |
| WO | 2010036524 A1 | 4/2010 |
| WO | 2010063828 A1 | 6/2010 |
| WO | 2010100273 A2 | 9/2010 |

OTHER PUBLICATIONS

TechSearch International. "Advanced Packaging Update: Market and Technology Trends, Table of Contents" Austin, Texas. vol. 4, Copyright 2007. 1 page.

Fujikura Ltd. "Electron Device Laboratory." Fujikura News, Apr. 2012. Retrieved from the Internet: <www.fujikura.co.jp/eng/f-news/2036148_4207.html> Retrieved on Aug. 26, 2012. pp. 1-2.

Fujikura Ltd. "JPCA Show 2012." Fujikura News, Jun. 2012. Retrieved from the Internet: <www.fujikura.co.jp/eng/f-news/2036217_4207.html> Retrieved on Aug. 26, 2016. pp. 1-2.

Fujikura Ltd. "Fujikura Developes World's Thinnest Substrate with Embedded Active and Passive Components." Fujikura News, Jul. 2011. Retrieved from the Internet: <www.fujikura.co.jp/eng/f-news/2034817_4207.html> Retrieved on Aug. 26, 2012. pp. 1-2.

Onishi, T. "Embedded Component Trend & Applications." Grand Joint Technology Ltd. Seminar on PCB&PKG Tech. Feb. 20, 2009. pp. 1-40.

JPCA Standard. "Standard on Device Embedded Substrate—Terminology/Reliability/Design Guide." JPCA EB01 2nd Edition. pp. 1-51.

JPCA Standard. "Standard on Device Embedded Substrate—Terminology/Reliability Test/ Design Guide: Table of Contents," JPCA EB01 Edition 4. Japan Electronica Packaging and Circuits Association. 2011. pp. 1-5.

JPCA Book Shop. Order Sheet for JPCA's Publications. Japan Electronics Packaging and Circuits Association. Mar. 19, 2012. 1 page.

International Search Report, Application No. PCT/EP2013/067703 (WO 2014033118), filing date Aug. 27, 2013, pp 1-4.

(56) References Cited

OTHER PUBLICATIONS

Japanse Abstract, JP 2011-007941 A, dated Jan. 13, 2011, Fujifilm Corp, pp. 1-20.
PCT/EP2013/067703—International Preliminary Report on Patentability dated Feb. 27, 2015, 12 pages.

\* cited by examiner

FIG. 1A Cross-section with Active and Passive Embeds
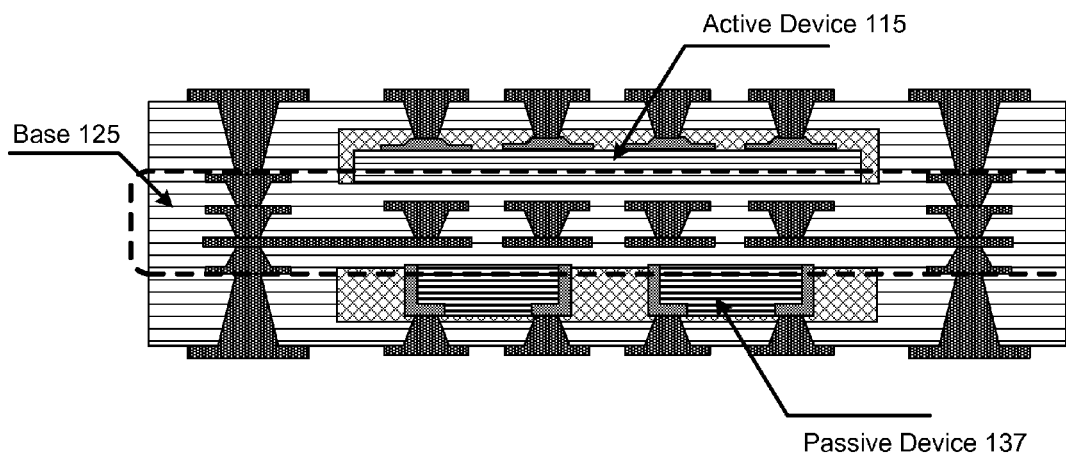
FIG. 1B Plan View of Embeds
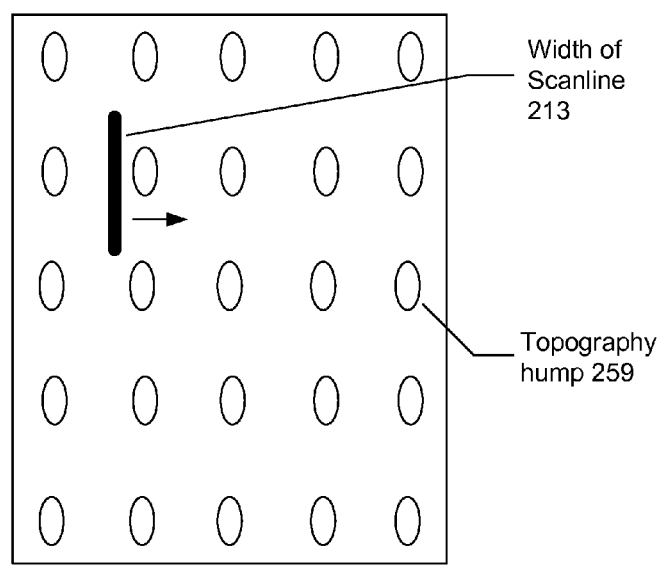

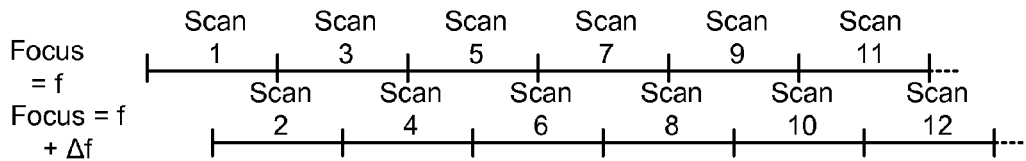
FIG. 2 - Side views of interlaced multipass printing with focus drilling
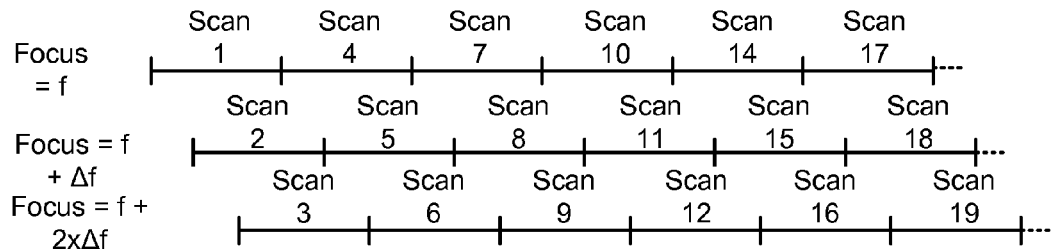
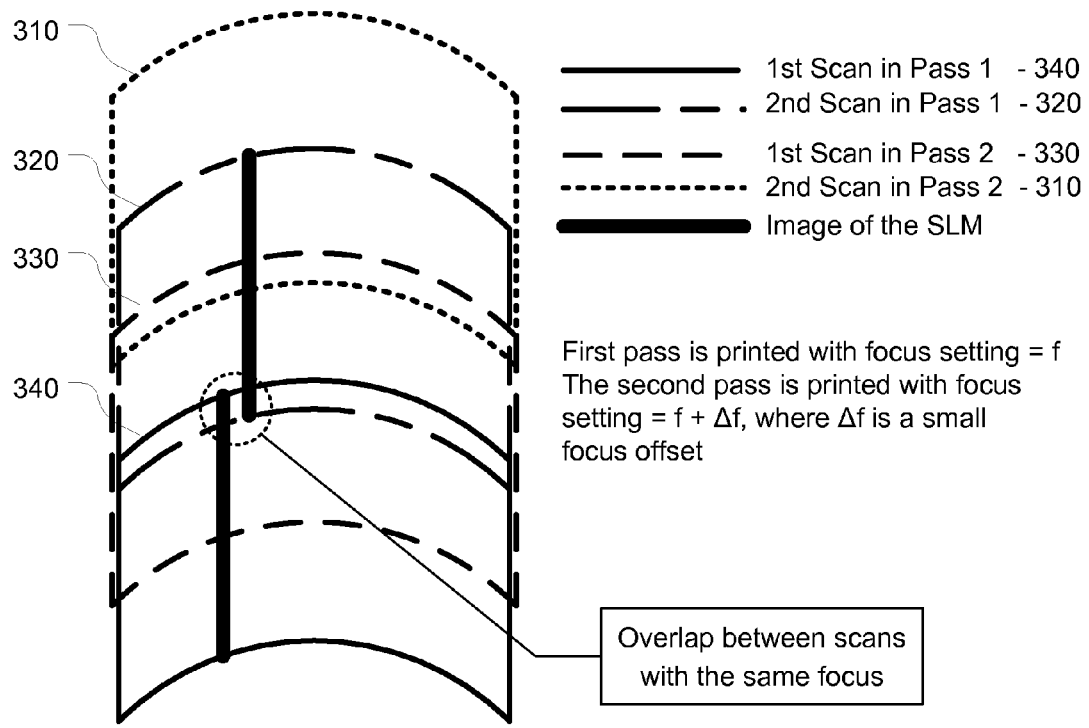
FIG. 3 – Top view of interlaced two-pass printing with two focuses FIG. 4 – Composite exposure with focus drilling
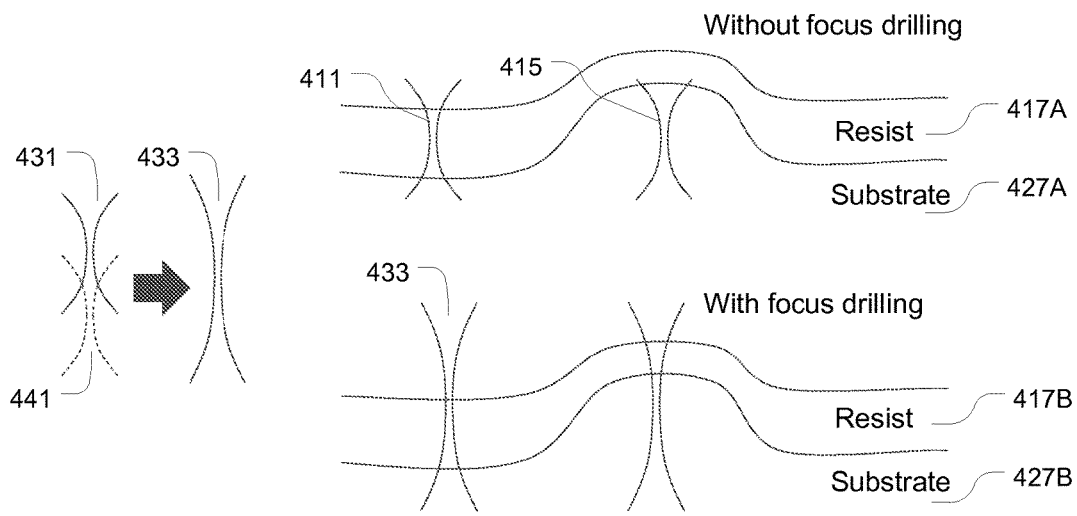
FIG. 5 – Writing modulators without and with overlap/interlacing
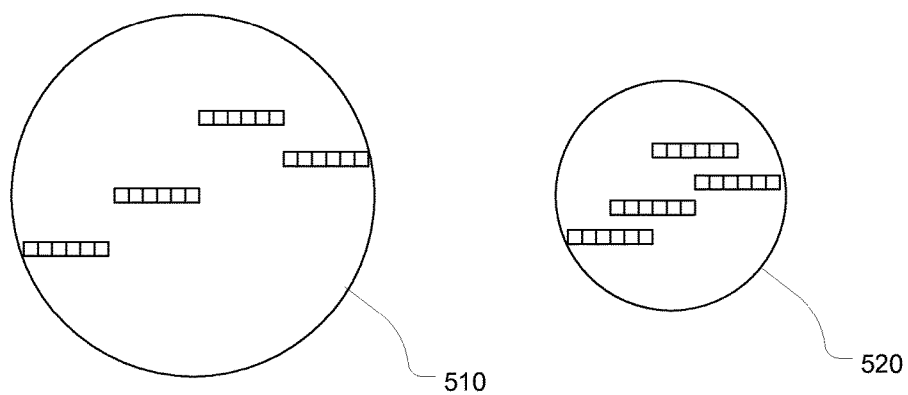

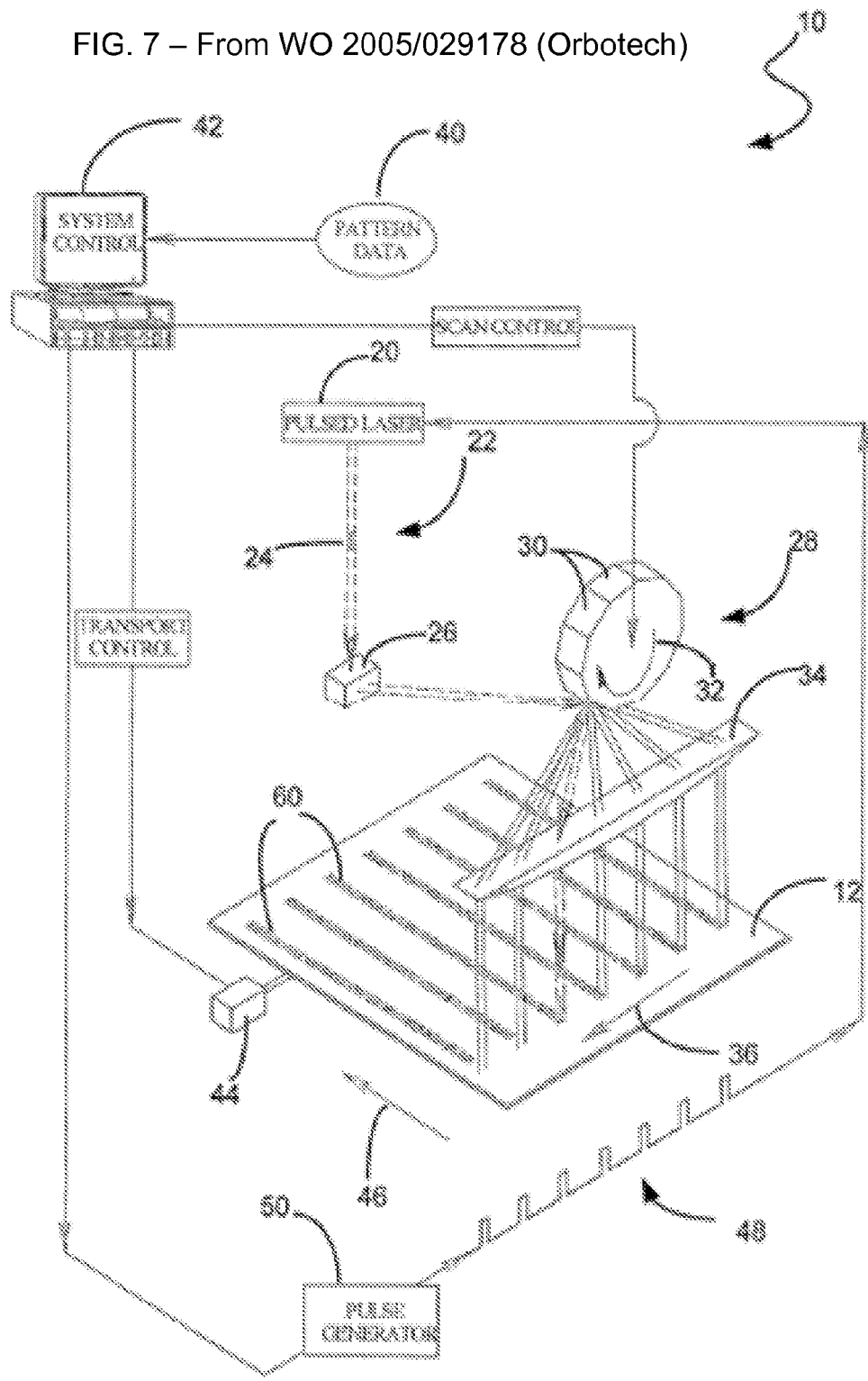
FIG. 7 – From WO 2005/029178 (Orbotech)

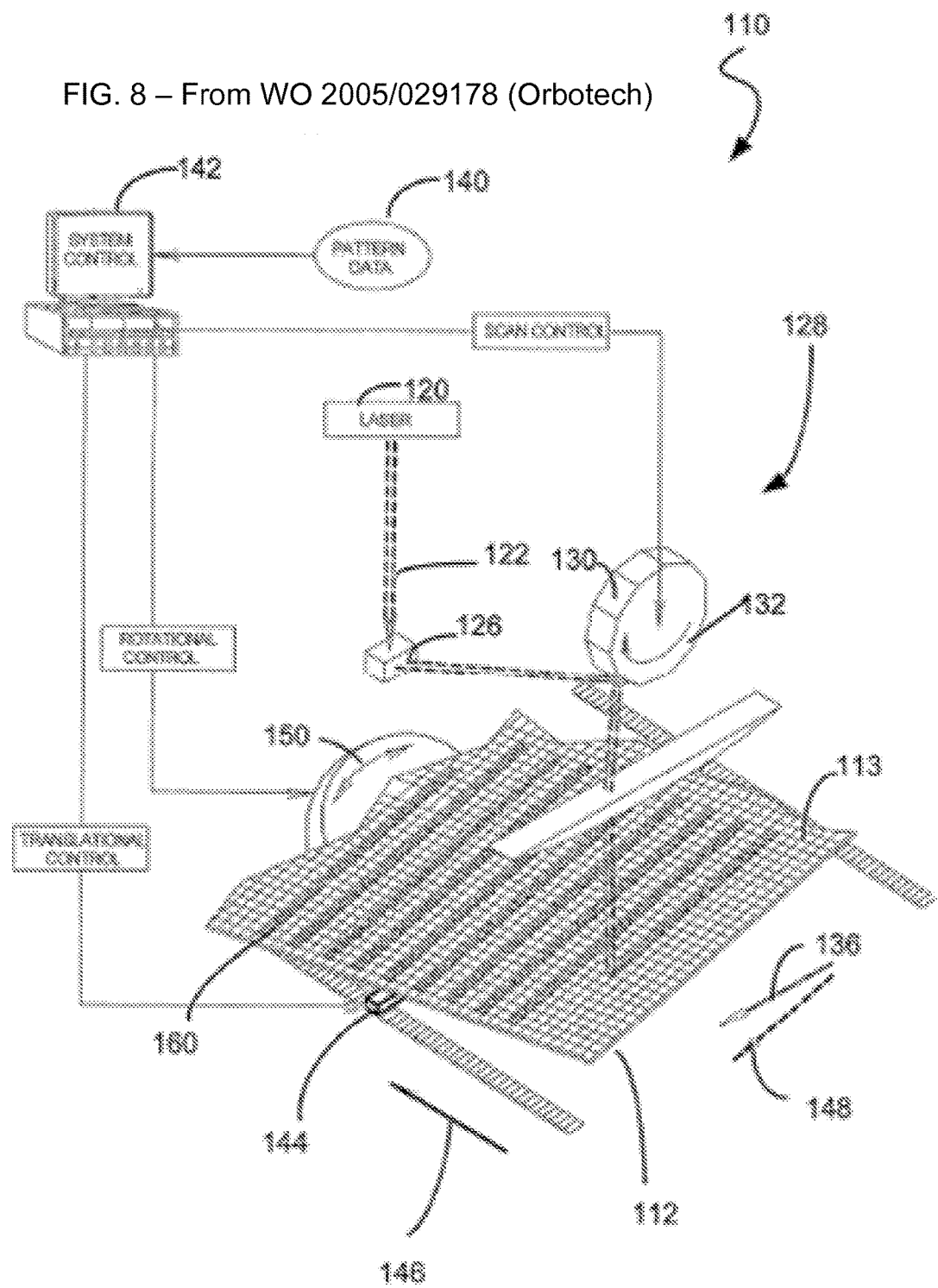
FIG. 8 – From WO 2005/029178 (Orbotech)

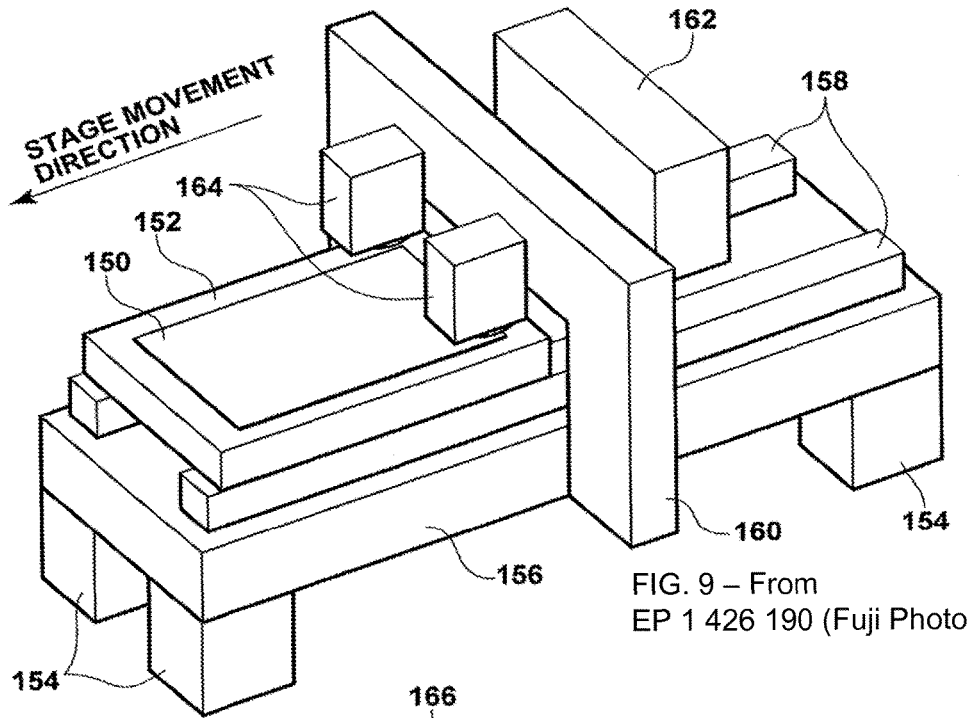
FIG. 9 – From EP 1 426 190 (Fuji Photo Film)
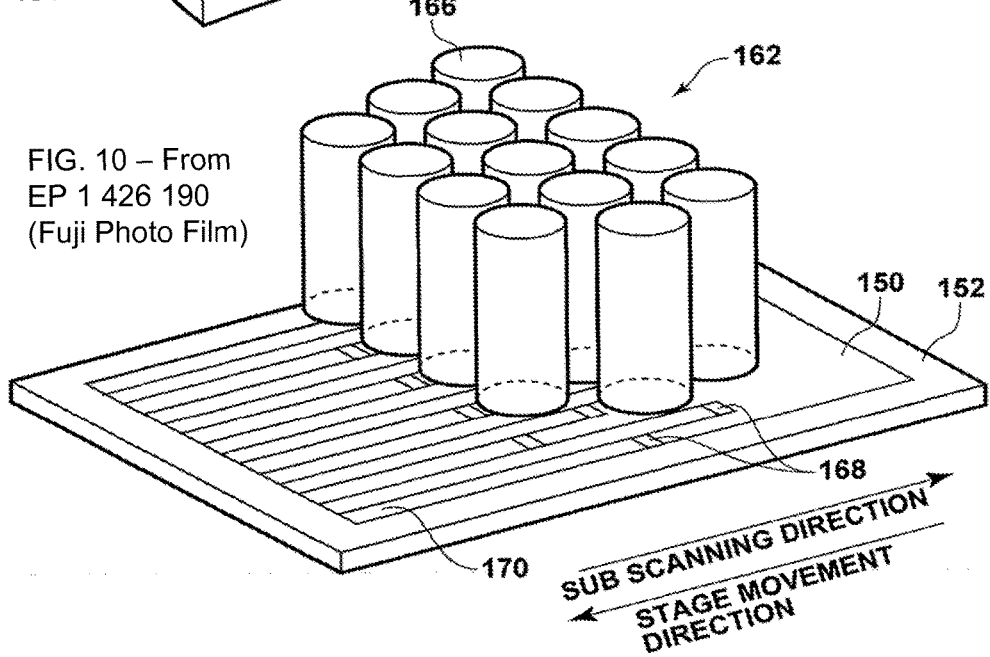
FIG. 10 – From EP 1 426 190 (Fuji Photo Film)

FIG. 11 – From
EP 1 426 190 (Fuji Photo Film)
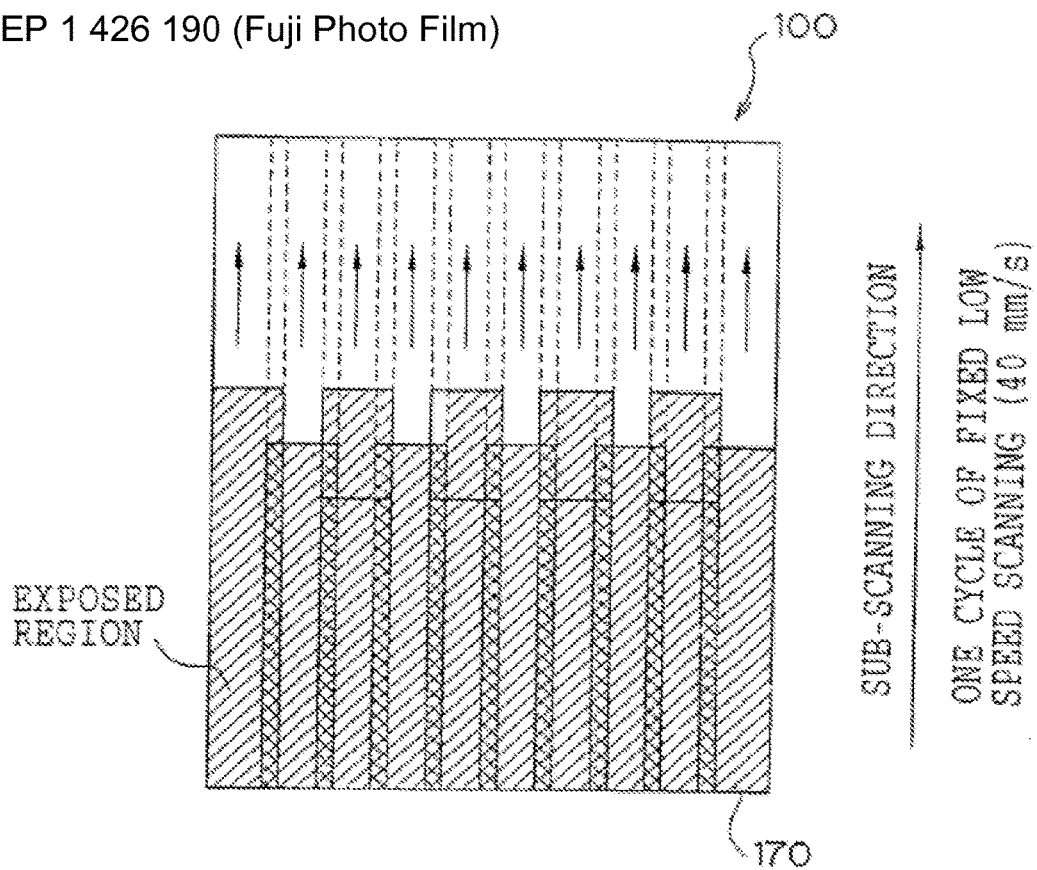
FIG. 12 – From
EP 1 426 190 (Fuji Photo Film)
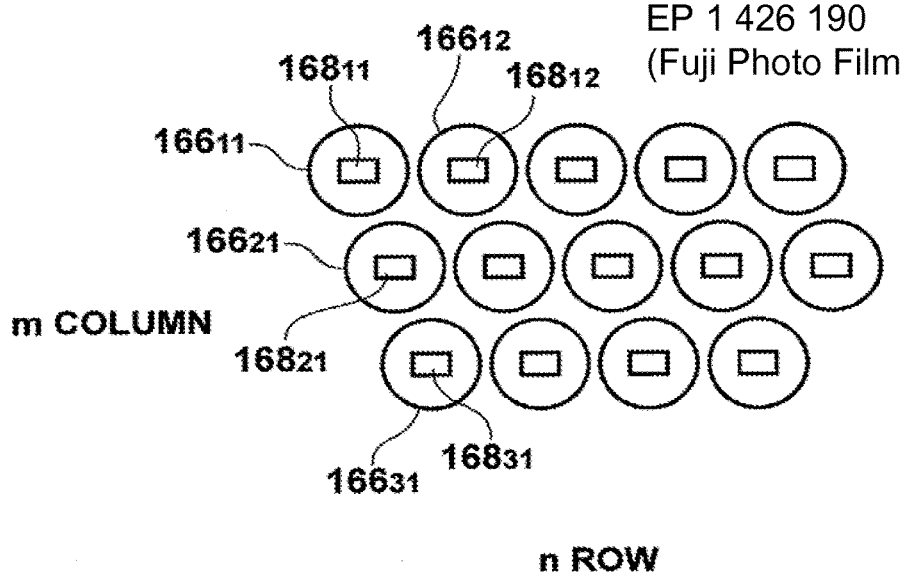

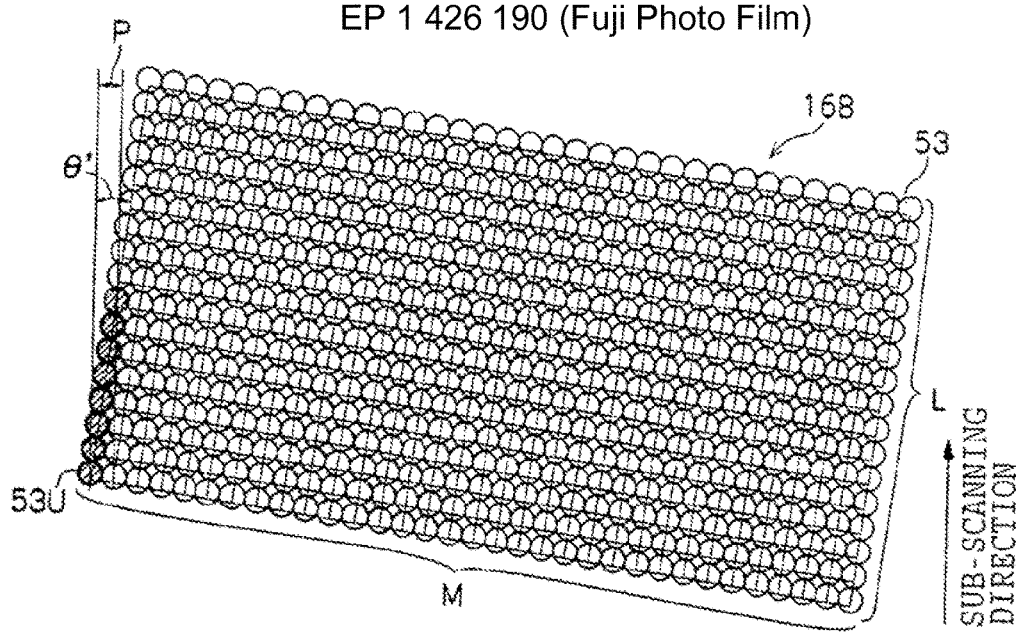
FIG. 13A – From
EP 1 426 190 (Fuji Photo Film)
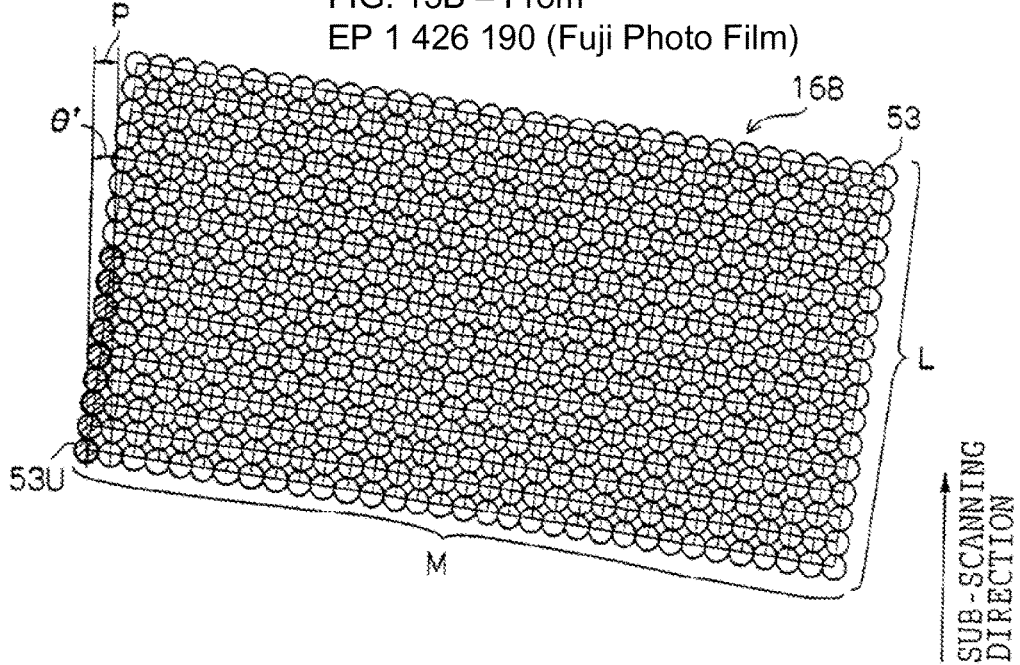
FIG. 13B – From
EP 1 426 190 (Fuji Photo Film)

US 10,149,390 B2

MASKLESS WRITING OF A WORKPIECE USING A PLURALITY OF EXPOSURES HAVING DIFFERENT FOCAL PLANES USING MULTIPLE DMDS

RELATED APPLICATIONS

This application is related to and claims the benefit of three provisional applications, U.S. Provisional Application No. 61/693,716 filed on Aug. 27, 2012, entitled "Maskless Writing of a Workpiece Using a Plurality of Exposures Having Different Focal Planes" naming inventor Per Askebjer, et al.; U.S. Provisional Application No. 61/696,135 filed on Sep. 1, 2012, entitled "Maskless Writing of a Workpiece Using a Plurality of Exposures Having Different Focal Planes Using Multiple DMDs" naming inventor Per Askebjer, et al.; U.S. Provisional Application No. 61/696,152 filed on Sep. 1, 2012, entitled "Maskless Writing of a Workpiece Using a Plurality of Exposures Having Different Focal Planes Using Multiple DMDs" naming inventor Per Askebjer, et al.

These three provisional applications are hereby incorporated by reference.

A PCT application is being filed contemporaneously with this US application.

BACKGROUND

The technology disclosed relates to accommodating embedded substrates during direct writing onto a workpiece such as a substrate or printed circuit board and to other patterning problems that benefit from an extended depth of focus. In particular, it relates to multi-focus direct writing of a workpiece by the continuous or step-wise movement of the workpiece during the sequence of exposures having different focus planes.

For several years, efforts have been under way to embed active and passive components in printed circuit substrates. The Japan Electronics Packaging and Circuits Association (JPCA), for instance, has published a series of standards related to device embedded substrates. E.g., JPCA-EB01— 2nd Edition, Standard on Device Embedded Substrate— Terminology/Reliability/Design Guide (June 2009) (pp. 1-51).

Recently, the assignee of this patent began a pioneering introduction of a direct writer for patterning substrates. These inventors recognized a new problem associated with direct writing of substrates that does not seem to have been previously addressed. That is, embedded devices are relatively thick compared to normal traces on a substrate. When embedded devices are produced, the substrate becomes uneven, causing various complications.

Accordingly, an opportunity arises to introduce new direct writing technologies that compensate for unevenness of a substrate. Improved patterning flexibility and precision may result, in at least some implementations of the technology disclosed.

PRIOR PUBLICATIONS

This disclosure is intended to be read in conjunction with the following documents, which are hereby incorporated by reference, some of which describe writing platforms that can be modified to implement the technology disclosed.

U.S. Pat. No. 7,923,182, entitled "Multi-Focus Method Of Enhanced Three-Dimensional Exposure Of Resist".

US Pat. Pub. 2010/0229146 A1, entitled "Variable Overlap Method and Device for Stitching Together Lithographic Stripes".

US Pat. Pub. 2011/0213479 A1, entitled "Method and Apparatus for Performing Pattern Alignment to Die".

US Pat. Pub. US 2010/012743 (May 27, 2010), entitled "Image Reading And Writing Using a Complex Two-Dimensional Interlace Scheme", which has issued as U.S. Pat. No. 8,351,020.

International Publication WO 2005/029178 assigned to Orobtech.

European Patent Specification Pub. No. 1 426 190 B1, which overlaps with U.S. Pat. No. 7,123,417, both assigned to Fuji.

U.S. Pat. No. 7,839,484 assigned to Hitachi.

SUMMARY

The technology disclosed relates to accommodating embedded substrates during direct writing onto a workpiece such as a substrate or printed circuit board and to other patterning problems that benefit from an extended depth of focus. In particular, it relates to multi-focus interleaved writing and may be used to produce an effective total depth of focus of a first and a second writing beam in overlapping areas that is greater than the effective depth of focus of any of the first or second writing beam alone. In one implementation, a multi-arm rotating direct writer is configured for interleaved writing focused on two or more focal planes that generally correspond to two or more surface heights of a radiation sensitive layer that overlays the uneven workpiece. Alternating arms can produce interleaved writing to the two or more focal planes. Further details and alternative implementations appear in the accompanying figures, claims, and description.

BRIEF DESCRIPTION OF THE DRAWINGS

FIGS. 1A-B are a simplified cross-section and plan view of a substrate with an embedded device.

FIG. 2 illustrates interleaving of writing to two and three focal planes, respectively.

FIG. 3 is a simplified plan view of overlap for two pass writing with interleaved writing focused on two focal planes using a rotating arm writer.

FIG. 4 illustrates increased effective depth of focus with multiple focal planes.

FIGS. 5 and 6A-B illustrate exposing a workpiece using multiple modulators in various arrangements.

FIGS. 7-8 are reproduced from WO 2005/029178 to illustrate a writing platform that can be modified to implement the technology disclosed.

FIGS. 9-13A-B illustrate an image generating platform described in EP 1 426 190 B1 and are reproduced from that publication.

DETAILED DESCRIPTION

Figure 6A:
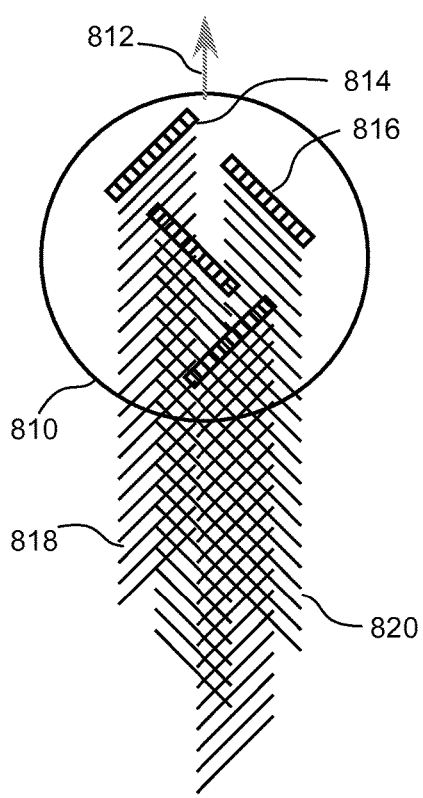

The following detailed description is made with reference to the figures. Sample implementations are described to illustrate the technology disclosed, not to limit its scope, which is defined by the claims. Those of ordinary skill in the art will recognize a variety of equivalent variations on the description that follows.

The technology disclosed can be applied to laser pattern imaging of workpieces. Patterning of a workpiece surface is accomplished using a laser direct imaging device. For example, patterning by of a layer on the workpiece's surface may include exposing a photoresist or other photosensitive material, annealing by optical heating, ablating, or creating any other change to the surface by an optical beam.

Examples of products produced using patterning steps include printed circuit boards (PCBs), substrates, flexible roll substrate, flexible displays, wafer level packages (WLPs), flexible electronics, solar panels and display. The technology disclosed is directed to patterning a photosensitive surface on a workpiece carrying a surface layer upon which a pattern can be printed with a laser direct imaging system.

Operating Environment

The technology disclosed can be implemented using a laser direct imaging (LDI) system, as described in the prior art publication US 2010/0142757 by the applicant, which is hereby incorporated by reference. The '757 publication is as an example of such a machine that can be adapted to practice the technology disclosed. In the system described by the '757 application, a laser beam is scanned over a photosensitive surface layer of a workpiece to expose the layer with a pattern in accordance with pattern image data. Other implementations of the technology disclosed may include patterning equipment. For example, equipment for patterning by projecting, writing or printing a pattern on a surface that may accomplish the patterning by exposing a photoresist or other photosensitive material, annealing by optical heating, ablating, creating any other change to the surface.

Explanations of Terminology and Embodiments Used in this Text

Depth of focus: For the purpose of this application, the term depth of focus is used to denominate the total range of focus that can be tolerated, i.e. the range of focus that keeps the resulting printed features within a variety of specifications such as e.g. linewidth.

Unidirectional sequence of exposures: For the purpose of this application, the term "unidirectional sequence of exposures" is used to denote a sequence of exposures by direct imaging of a workpiece with unidirectional relative movement on one axis between a writing unit and the workpiece. A unidirectional sequence of exposures may be accomplished in several ways.

The workpiece can be exposed by continuous scanning of the workpiece in one direction during continuous relative movement of the workpiece another direction. A direct write tool, in this implementation, exposes the workpiece by scanning a stripe or strip of the workpiece area during the continuous movement of the workpiece. The rotor-based LDI tool with several writing heads on rotor arms works this way. Alternating arms of the rotor can be focused on different focal planes. The exposure uses a unidirectional series of exposures in the sense that the workpiece runs through the rotor scanning device and the relevant surface has been exposed at two or more focal planes in one unidirectional movement of the workpiece through the device.

The workpiece also can be exposed by step-and-scan exposure. In one implementation, step and scan exposure combines the scanning motion of a writing head scanning a strip of the workpiece with a step-and-repeat relative motion of the writing head and workpiece. For instance, a stage moves the workpiece in a step and scan fashion under the writing head. The workpiece is lying still during an exposure by scanning a strip or stripe of the workpiece area.

The workpiece can be exposed by a stamp flashing and continuous or step-and-flash exposure. The assignee's Sigma™ line of products use an SLM to project stamped patterns onto the workpiece in brief flashes. The flashes may be short enough to freeze any motion of the workpiece. Either continuous movement of the workpiece or step and flash exposure can be used. This process uses unidirectional movement of the workpiece in the sense that the stamps are applied in a series along a direction generally orthogonal to the relative movement of the workpiece. An area or the whole width of the workpiece is exposed at two or more focal planes in one unidirectional movement of the workpiece. When the stripe exposed in the first unidirectional sequence of exposures is narrower than the whole width of the workpiece, the unidirectional movement pattern may be repeated for additional stripes.

Workpiece: For the purpose of this application, the term workpiece is used to denote any carrier of a surface layer upon which a pattern can be printed with a laser direct imaging system. For example the workpiece may be a silicon substrate, a silicon wafer for a printed circuit board workpiece, or an organic substrate. Workpieces may have any shape, such as circular, rectangular or polygonal, and may have any size for example in a piece or in a roll.

Die has a slightly different meaning in the context of embedded substrates than in patterning a wafer with dies. For the purpose of this application, the term die is used to denote an active or passive component or any other component associated with electronics that is fabricated into a workpiece. For example, a die may include a small block of semiconducting material, on which a given functional circuit is fabricated.

Example applications of the technology disclosed relate to scanning of workpieces, such as a substrate or wafer, for writing patterns and/or images. Example substrates or wafers include flat panel displays, printed circuit boards (PCBs), flexible printed circuit boards (FPBs), flexible electronics, printed electronics, substrates or workpieces for packaging applications, photovoltaic panels, and the like.

Suitable modulators to be used in connection with the writing method of the technology disclosed include the polygon scanner of Orbotech, acousto-optic and electro optic modulators and directly modulated lasers. Micromechanical Spatial Light Modulators (SLMs) such as Grating Light Valves (GLVs from Silicon Light Machines) and Digital Mirror Devices (DMDs from Texas Instruments) as well as analog SLMs (from Micronic Laser Systems and Lucent) also may be suitable. Analog SLMs may rely on either tilting or piston driven mirrors. Either configuration may render shades of grey due to destructive interference effects.

Exposure with scanning laser light may be modeled as Gaussian beams with a Gaussian intensity distribution. Other optical power density distributions are naturally possible. The beam, or beams in a multi-beam writer, can be focused in the laser writer tool's final lens system either on the upper surface of the photoresist, or somewhere between the resist surface and the substrate surface in the downwards z-direction. During propagation through the photoresist layer, a Gaussian beam diverges (widens) due to its wave property and other optical effects, making the resulting lateral (x, y) as well as vertical (z) writing resolution deteriorate. The depth-of-focus is determined by the numerical aperture (NA) of the lens system of the writer system, together with the refractive index of the photoresist and of the ambient medium. Furthermore, the power density or deposited/absorbed exposure dose varies with the depth in the resist.

The principle of multiple focal planes has been used with steppers that project a patterns from one or more masks onto a workpiece such as a wafer. However, a stepper can not produce an interlaced, or interleaved, multipass due to its static mask. The method and device of the technology disclosed is thus not relevant for an exposure system using a static mask to pattern a workpiece but may be used for any kind of laser direct imaging (LDI) with a scanning exposure system, e.g. having overlapping scan sweeps, with a scan-and-repeat exposure system or with a multi-parallel-DMD writing systems equal or similar to what is disclosed in U.S. Pat. No. 7,123,417 or U.S. Pat. No. 7,839,484.

A new application field called embedded substrates is emerging within panel production. These panels have a much larger topography than a built up substrate on a standard panel. FIG. 1A is a one example of a cross-section of a substrate with an embedded device. This diagram is reproduced from JPCA-EB01—2nd Edition, Standard on Device Embedded Substrate—Terminology/Reliability/Design Guide. This example suggests the new problem of unevenness of the target radiation sensitive layer, when one observes how much thicker an embedded device (active 115 or passive 137) is than a trace on the substrate (in the base 125 area). The difference in surface heights to be exposed is in the vicinity of or larger than the depth of focus of the writing beam, which typically has a Gaussian distribution. FIG. 1B is a simplified plan view of the embedded devices. The width of a scanline 213 is illustrated as wider than a topography hump 259 resulting from an embed.

Despite the larger topography, the requirements on resolution, the smallest feature printable within specification, remain demanding. Again, the panel topography is typically in the vicinity of or larger than the optical depth of focus. This depth of focus depends on optical factors such as resolution requirements and exposure wavelength. It is not possible for current exposure systems to both meet stringent resolution requirements while providing a large depth of focus. This presents a problem for embedded substrates.

The embedded substrate panels typically include large topography steps 259 that are narrower than the scan width 213 of the exposure system, as illustrated in FIG. 1B. Changing focus within a scanning line, over less than the width of a single scan, is very difficult, both costly to implement and difficult to maintain. The problem can be encountered in any scanning exposure system that having scan widths that span large topography steps, especially two or more large topography steps.

The usable depth of focus that produces usable pattern features is defined by the optical system. Writing the pattern on the substrate multiple times with different focus for each pass has the advantage that the focal depth experienced by the resist on the substrate is increased, as compared to the optical depth of focus that the optics can deliver in a single exposure. See, e.g., FIG. 4. This is helpful for substrates with large topography features, such as embedded passive or active devices. Laying out the multiple focus depth writing passes in an interlaced pattern accomplishes an extended depth of focus within the standard writing scheme—in some implementations, only the alternating focus depths change during writing, not the pattern written. A bonus advantage is that an averaging effect is accomplished that evens out nonuniformities across the frame of a modulator such as spatial light modulator (SLM). The interlaced writing scheme may be implemented with the assignee's LDI writing engine, without any writing speed loss by just increasing the speed of the deflecting element used for scanning the laser beam impinging on the workpiece.

The technology disclosed may be used by a system, or pattern generator, for exposing a radiation sensitive layer on an uneven workpiece covered with, comprising:
one or more laser sources configured to generate at least first and second writing beams,
one or more optics adapted to project the first and second writing beams onto the uneven workpiece with first and second focal planes of the respective writing beams that target mutually different focal plane positions on a surface of the uneven workpiece, and
one or more controllers that are configured to interlace writing passes consecutively exposed by the first and second writing beams on overlapping areas of the uneven workpiece. The technology disclosed may be used by a system, or pattern generator that exposes a radiation sensitive layer on an uneven workpiece covered with, comprising:
one or more laser sources that generate at least first and second writing beams,
one or more optics that project the first and second writing beams onto the uneven workpiece with first and second focal planes of the respective writing beams that target higher and lower positions on a surface of the uneven workpiece, and
one of more controllers that interlace writing beams (or passes) consecutively exposed by the first and second writing beams on overlapping areas of he uneven workpiece.

The technology disclosed can produce an extended effective depth of focus by printing multiple passes or exposures in a single pass with a slightly different focus setting for each exposure. The slightly degraded resolution can, in many cases, be overcome or compensated for by reoptimizing exposure dose and pattern bias to fit the new exposure conditions. When the goal is to find the optimum setting for the use of multiple focal planes to achieve the best resolution with the best depth of focus, the pattern bias, dose and multiple focal planes can be adjusted to produce the best resolution and depth of focus.

The technology disclosed may be used to produce an effective total depth of focus of a first and a second writing beam in overlapping areas that is greater that the effective depth of focus of any of the first or second writing beam alone.

The technology disclosed may also be used by a writing system, or pattern generator, to change the effective total depth of focus and resolution during the writing of a single pass. Thus, the writing system may be configured to change the effective total depth of focus and resolution during the unidirectional sequence of exposures in a single pass. The change of effective total depth of focus and resolution may be accomplished by configuring at least two of the plurality of exposure heads (or writing heads) to target mutually different focal plane positions during a portion of time of a single writing pass.

The technology disclosed enable high-complex single pass writing of a workpiece where at least a first portion of the surface area of a workpiece is exposed during a portion of the single pass using a high resolution mode (and with a smaller effective total depth of focus) of a writing system and at least a second portion of the surface of the same workpiece area is exposed during a portion of the same single pass using an extended effective total depth of focus mode (and with a lower resolution) of the same writing system. The direct writing of the surface area of the workpiece may then be performed by using a system configured to produced unidirectional writing in a one sequence of exposures where at least a portion of the surface area of the workpiece is exposed in a single pass using a plurality of exposure heads targeting mutually different focal plane positions. When the writing system is using the extended effective total depth of focus mode for exposing a first portion of the surface of the workpiece, the effective total depth of focus of the overlapping first and second writing beams in the first portion of the surface area is greater than an effective depth of focus of any of the first or the second writing beam alone.

In certain embodiments of the technology disclosed for implementing multipass in a scanning system is to decrease the scan pitch to ((1/number of used focus steps)×scan width) and change the focus for each scan in a staircase fashion. The result is that the shift between consecutive scans will be ½ of the scan width for 2-pass, with different focus every second scan. See, FIG. 2, first example of two-pass printing. For 3-pass the scan shift will be ⅓ of the scan width and focus will change in three steps with the same focus repeating every third scan, and so on, see the figures. FIG. 2, second example of three-pass printing. More than three passes could be used, especially for extreme topography steps or extreme resolution requirements. As an additional technical effect, the interlaced, interleaved or overlapping multipass writing schemes suggested in this application will also have an averaging effect because different parts of the scanning line will overlap. Hence, as mentioned above, the method of the technology disclosed of having interleaved, or interlaced, scanning of multiple scans with mutually different focal depths will also average out many irregularities that can be present across the scanning widths, or scanning lines, of the different scans of the exposure system. The scanning width, or scanning lines, of the exposure system may e.g. relate to or correspond to the width of one of the axes of a frame of a modulator such as spatial light modulator (SLM), e.g. the longest axis of the frame, where images of the SLM frame is continuously scanned in a scan sweep over the workpiece.

FIG. 2 illustrates interleaving of writing to two or three focal planes. In the first part of the figure, odd and even numbered writing passes alternate. In the second part of the figure, three focal planes are illustrated with alternating in cycles of three overlapping exposures.

FIG. 3 is a simplified plan view of overlap for two pass writing with interleaved writing focused on two focal planes, using a rotating arm writer. This plan view includes both interleaved writing (e.g., 320 interleaved between 310 and 330) and butting or overlap areas (e.g., 320 overlapping 340) printed along arcs using a rotating arm device. The physical relationship between first (320, 340) and second (310, 330) writing passes is illustrated. Other types of devices will produce butting or overlapping between exposing stripes or strips focused at the same focal plane.

FIG. 4 illustrates increased effective depth of focus. This is a conceptual diagram. In the figure, resist 417A,B overlays a substrate 427A,B. The substrate is contoured, e.g. at 415, due to embeds. Focused exposure at two heights 432, 441 produces a composite depth of focus 433. The composite depth of focus 433 does a better job handling a contoured substrate than 411, 415.

Using multipass printing with different focus, or focal depth, for each pass, allows for high-resolution direct patterning of substrates with larger topography, e.g. substrates with embedded dies or components, than what normally can be printed can be printed within specification. In addition, using multipass for direct imaging of a workpiece may itself have also been found to produce better stability and sometimes higher resolution with the resist type that is currently used with the exposure systems of today. In a scanning exposure system, e.g. a system using several rotating optical arms as described in this disclosure or one or multiple deflecting elements such as polygon(s) for scanning the workpiece, the interlaced multipass printing scheme may be implemented at no throughput cost by just increasing the rotating speed of the rotating arm or polygon(s). It is desirable to print the substrate in one continuous sweep without having to go back and start printing the pattern once more to produce a further focus step. The interlaced multipass printing allows for that and is therefore well suited for any of the LDI architectures described in this application.

As seen in FIG. 1 of WO 2005/029178 (Orbotech), reproduced herein as FIG. 7, and in accordance with one embodiment of the technology disclosed, the system includes a laser, e.g. a pulsed or continuous laser, outputting a laser beam. The laser beam(s) are passed through suitable pre scan optics and directed to impinge on a scanner, such as a rotating polygon having a plurality of facets.

As the at least one polygon of the scanner rotates, the laser beam impinges on one of the facets of the polygon, which then passes the beam through scanning optics. Typically, scanning optics include an f-θ scan lens and other optical elements. As the polygon rotates, beam is scanned along a scan path in a scan direction.

Pattern data corresponding to a pattern to be exposed is supplied to a system controller. System controller controls one or more of: the rotational speed of the polygon of scanner, the mutual translation of panel relative to the scanner and a clock governing the generation of laser pulses, if the laser source is a pulsed laser source. Although FIG. 1 of WO 2005/029178 depicts a translator moving panel while scanner remains stationary, actual system design may be such that panel is kept stationary while scanner is moved.

Upon the completion of a scan path, that is to say once laser beam reaches the end of a swath to be scanned, which may, but does not have to be the entire width of panel, the next facet of the polygon in scanner is rotated into place to instantaneously return laser beam to the beginning of the scan path. Laser beam is once again scanned along the scan path. Because of mutual relative translation between panel and scanner, provided for example by a panel transporter, new locations on panel, adjacent to previously scanned locations, are now scanned. It is thus noted that each scan path is contiguous with a previous scan path, thereby generating an additive portion to each exposed region to extend the exposed region as a strip in the cross scan direction.

The technology disclosed of interlaced scans with different focal planes, or focus depths, to extend the total focus range, or depth of focus (DoF) may be implemented in the polygon scanner system equal or similar to the exposure system depicted in FIG. 1 of WO 2005/029178 by changing the focal depth, or focal plane, of the optical system between the scan paths once the laser beams reaches the end of a swath to be scanned, where a single optical path and a single scanner deflecting the laser beam, such as a polygon scanner, is used. The technology disclosed may also be implemented in a new type of polygon scanner system having two or more parallel optical scanning systems for projecting scanning lines on a workpiece with separate optical paths and polygons where each of the plurality of optical scanning systems, or writing units, may have different focal depths and where the plurality of scan lines, or scan sweeps, are interleaved to provide an extended total focus range, i.e. depth of focus, in accordance with the technology disclosed.

As seen in FIG. 2 of WO 2005/029178, reproduced herein as FIG. 8, system 110 includes a laser 120 outputting a laser beam 122 may be a continuous wave laser beam or a pulsed laser beam, provided, for example by a Q-switch diode pumped solid state laser. In accordance with an embodiment of the technology disclosed, when a pulsed laser is used, as noted below system design (spot size, scanning speed, and the speed of mutual translation) needs to be such that a spot exposed by each of the pulses mutually overlaps at least one other spot in order to ensure the exposure of a continuous strip.

Laser beam 122 is passed through suitable pre-scan optics 126 and directed to impinge on a scanner 128, such as a rotating polygon having a plurality of facets 130. Pre-scan optics 126 typically include a plurality of lenses (not shown) which are selected to suitably shape laser beam 122 for exposing a continuous strip on panel 112.

As the polygon of scanner 128 rotates in the direction of arrow 32 (the scan direction), beam 122 impinges on one of the facets 130 of the polygon, which passes the beam through scanning optics 134. Typically, scanning optics 134 include an f-O scan lens and other optical elements (not shown). As the polygon rotates, beam 122 is scanned along a scan path in a nominal scan direction indicated by arrow 136.

During scanning, panel 112 and scanner 128 are mutually relatively translated, for example by a transporter 144, in a cross scan direction indicated by arrow 146. It is noted that because of the mutual relative translation during scanning, the actual direction of scanning is slightly skewed, as indicated by arrow 148.

It is a feature of the present embodiment that a rotator 150 establishes a mutual angular offset between panel 112 and scanner 128 during scanning. Thus, absent mutual relative translation of panel 112 and scanner 128, rows of pattern elements in pattern 113, intersect an axis corresponding to the nominal scan direction 136. Upon introduction of mutual relative translation between panel 112 and scanner 128, the actual scan direction matches the orientation of rows of pattern elements 113 thereby facilitating the continuous exposure of regions 160.

In FIG. 2 of WO 2005/029178, it is seen that pattern data 140 corresponding to a pattern to be exposed is supplied to a system controller 142. System controller 142 controls one or more of: the rotational speed of the polygon of scanner 128, the mutual translation of panel 112 relative to scanner 128 and rotational orientation of panel 112 relative to scanner 128.

Although FIG. 2 of WO 2005/029178 depicts a translator 144 moving panel 112 in the direction of arrow 146 (the cross scan direction) while scanner 128 remains stationary, actual system design may be such that panel 112 is kept stationary while scanner 128 is moved. The translator may operate to directly move panel 112, for example while panel 112 is supported on an air cushion, or it may operate to move a support table supporting panel 112.

Moreover, although FIG. 2 of WO 2005/029178 schematically shows a rotator 150 operative to rotate panel 112. It is noted that in accordance with an embodiment of the rotator 150 may operate directly on panel 112, or on a support table (not show) supporting panel 112, or it may rotate the scanner 128 relative to panel 112, while panel 112 is held stationary.

The rotator may be operative once panel is already placed on system 128, or it may rotate panel 112 prior to placing it on system 110, for example as part of a pick and place type loader.

System 110 is configured so that upon the completion of a scan path, that is to say once laser beam 122 reaches the end of a swath to be scanned, the next facet of the polygon in scanner 128 is rotated into place to instantaneously return laser beam 122 to the beginning of the scan path. System control 142 determines the appropriate relative angular orientation of panel 112 and scanner 128, along with the speed of translation and the speed of scanning so that each scan path corresponds to a stripe region 160 to be exposed, and to skip the region between stripes.

The technology disclosed of interlaced scans with different focal planes or focus depths to extend the total focus range, or depth of focus (DoF) may be implemented in the polygon scanner system equal or similar to the exposure system depicted in FIG. 2 of WO 2005/029178 by changing the focal depth, or focal plane, of the optical system between the scan paths once the laser beams reaches the end of a swath to be scanned, where a single optical path and a single scanner deflecting the laser beam, such as a polygon scanner, is used. The technology disclosed may thereby provide for an extended total focus range enabling the system to pattern features in the workpiece, e.g. embedded dies, that causes large topography steps that usually are smaller than the scan width of the exposure system and to average out irregularities that can be present across the scanning widths, or scanning lines, of the different scans of the exposure system.

The technology disclosed may also be implemented in a new type of polygon scanner system having two or more parallel optical scanning systems for projecting scanning lines on a workpiece with separate optical paths and polygons where each of the plurality of optical scanning systems, or writing units, may have different focal depths and where the plurality of scan lines, or scan sweeps, are interleaved to provide an extended total focus range, i.e. depth of focus, to be able to pattern features in the workpiece, e.g. embedded dies, that causes large topography steps that usually are smaller than the scan width of the exposure system and to average out irregularities that can be present across the scanning widths, or scanning lines, of the different scans of the exposure system.

Another platform that can benefit from application of multiple focal planes to accommodate an irregular surface is seen in EP 1 426 190 B1. FIGS. 1, 2, 3A-B and 8A-B are reproduced in this application as FIGS. 9-13.

This platform uses a DMD device, such as those manufactured by Texas Instruments, and individual lenses. It explains that a grating light valve or LCD shutter system could be substituted for the DMD as a modulator. The writing head is somewhat rotated, relative to the writing direction, as illustrated by FIGS. 12-13.

As shown in FIG. 9, the imaging device on the platform in EP 1 426 190 B1 is provided with a flat board-form stage 152, which adsorbs and retains a sheet-form photosensitive material 150 at a surface thereof. Two guides 158, which extend in a stage movement direction, are provided at an upper 45 face of a thick board-form equipment platform 156, which is supported by four leg portions 154. The stage 152 is disposed such that a longitudinal direction thereof is oriented in the stage movement direction, and is supported by the guides 158 so as to be so movable backward and forward. In this exposure apparatus, an unillustrated driving apparatus is provided for driving the stage 152 along the guides 158.

At a central portion of the equipment platform 156, an 'n'-shaped gate 160 is provided that straddles a movement path of the stage 152. Respective end portions of the 'n'-shaped gate 160 are fixed at two side faces of the equipment platform 156.

Sandwiching the gate 160, a scanner 162 is provided at one side, and a plurality of detection sensors 164 are provided at the other side. The detection sensors 164 detect leading and trailing ends of the photosensitive material 150. The scanner 162 and the detection sensors 164 are respectively mounted at the gate 160, and are fixedly disposed upward of the movement path of the stage 152.

The scanner 162 and detection sensors 164 are connected to an unillustrated controller which controls the scanner 162 and detection sensors 164. The scanner 162 and detection sensors 164 are controlled such that, at a time of exposure by exposure heads 166, the exposure heads 166 effect exposure with predetermined timings.

As shown in FIGS. 10 and 12, the scanner 162 is equipped with a plurality of the exposure heads 166, which are arranged substantially in a matrix pattern with m rows and n columns (for example, three rows and five columns). In this example, in consideration of width of the photosensitive material 150, four of the exposure heads 166 are provided in the third row, and there are fourteen exposure heads 166 in total. Note that when an individual exposure head which is arranged in an m-th row and an n-th column is to be referred to, that exposure head is denoted as exposure head $166_{mn}$.

Exposure areas 168 are covered by the exposure heads 166 have rectangular shapes with short sides thereof aligned in a sub-scanning direction, as in FIG. 10, and are inclined at a predetermined inclination angle G, which is discussed later, with respect to the sub-scanning direction. Hence, in accordance with movement of the stage 152, band-form exposed regions 170 are formed on the photosensitive material 150 at the respective exposure heads 166. Note that when an exposure area corresponding to an individual exposure head which is arranged in an m-th row and an n-th column is to be referred to, that exposure area is denoted as exposure area $168_{mn}$.

As shown in FIGS. 11-12, in each row the respective exposure lenses, which are arranged in a line, are offset by a predetermined interval in a row arrangement direction (which interval is an integer multiple (two in the present embodiment) of the long dimension of the exposure areas), such that the band-form exposed regions 170 partially overlap with respective neighboring the exposed regions 170. Thus, a portion that cannot be exposed between exposure area $168_{11}$ and exposure area $168_{12}$ of the first row can be exposed by exposure area $168_{21}$ of the second row and exposure area $168_{31}$ of the third row.

Feeding modulated radiation to exposure areas $166_{11}$ to $166_{mn}$, a digital micromirror device (DMD) 50 is provided to serve as a spatial light modulation element for modulating an incident light beam at each of pixels in accordance with image data. The DMD 50 is connected with an unillustrated controller, which is provided with a data processing section and a mirror driving control section.

At the data processing section of this controller, on the basis of inputted image data, driving signals are generated for driving control of each micromirror in a region of the DMD 50 at the corresponding exposure head 166 which region is to be controlled. Herein, the controller includes an image data conversion function for making resolution in a row direction higher than in an original image.

By raising the resolution thus, various processes and corrections of the image data can be implemented with higher accuracy. For example, in a case in which a number of pixels employed is altered in accordance with an inclination angle of the DMD 50 and a row pitch is corrected, as described later, correction with higher accuracy is enabled. This conversion of the image data enables conversions which include magnification or reduction of the image data.

The mirror driving control section controls the angle of a reflection surface of each micromirror of the DMD 50 at the corresponding exposure head 166 on the basis of the control signals generated at the image data processing section. Control of the angles of the reflection surfaces is described later.

A fiber array light source 66, a lens system 67 and a mirror 69 are disposed in this order at a light incidence side of the DMD 50. The fiber array light source 66 is equipped with a laser emission portion at which emission end portions (light emission points) of optical so fibers are arranged in a row along a direction corresponding to the direction of the long sides of the exposure area 168. The lens system 67 corrects laser light that is emitted from the fiber array light source 66, and focuses the light on the DMD 50. The mirror 69 reflects the laser light that has been transmitted through the lens system 67 toward the DMD 50.

A lens system is shown and discussed in EP 1 426 190 B1. For the use of multiple focal planes, the lenses system would be configured to rapidly change the effective focal plane. For instance, the focal plane depth from the lens might change between exposures produced from the modulated DMD device.

FIGS. 13A-B show the exposure area 168, which is a two-dimensional image provided by one of the DMDs 50. The exposure area 168 is divided into respective pixels of M columns by L rows, corresponding to exposure beams 53.

In the example of FIGS. 13A-B, M=33 and L=17. However, in practice, as mentioned above, one of the exposure areas 168 will often be structured by a greater number of the exposure beams 53 than in this example. Therefore, when a case for which specific numbers are given is described here below, it should be assumed that M=1024 and L=256 therein.

The DMD 50 is inclinedly disposed such that this exposure area 168 is angled at the predetermined inclination angle with respect to the sub-scanning direction. When the exposure area 168 is inclined thus, a row pitch of scanning paths (scanning lines) of the exposure beams 53 from the respective micromirrors becomes smaller (approximately 0.27 μm in the present embodiment), and is narrower than a row pitch of scanning lines in a case in which the exposure area 168 is not inclined and than a resolution of the image data itself (2 μm). is Thus, resolution can be improved.

Now, in a case in which the angle of the DMD is adjusted in order to incline the exposure area at the predetermined inclination angle as described above, it is difficult to bring accuracy of this angle adjustment to second-scale accuracy, and an actual inclination angle θ may be offset from the ideal inclination angle θ. However, regardless of the value of the actual inclination angle θ', it is preferable that a pitch P of the image in the row direction is fixed.

Accordingly, in the present embodiment, the number of pixels employed in the row direction is altered for imaging (image recording) in accordance with the actual inclination angle θ' by an unillustrated controller, and thus variation of the pitch P is suppressed to a certain so range.

For example, when FIGS. 13A-B are compared, the actual inclination angle θ' in FIG. 13B is smaller than the actual inclination angle θ' in FIG. 8A. Accordingly, in the case of FIG. 13B, the number of pixels employed in the row direction is increased relative to FIG. 13A. Thus, variation of the pitch P is countered and the pitch P is made substantially constant. Specifically, when numbers of hatched (in the drawing) pixels in the row direction in FIGS. 13A-B (employed pixels 53U) are considered, there are eight such pixels in FIG. 13A, in comparison to nine in FIG. 13B.

When the number of pixels employed is altered thus, the pitch of the image in the row direction is finely adjusted. In accordance therewith, conversion of the image data is preferable. Figures are provided in in EP 1 426 190 B1 that extend the example in FIGS. 13A-B.

The technology disclosed of interlaced scans with different focal planes or focus depths to extend the total focus range or depth of focus (DoF) may be implemented in the DMD system equal or similar to the exposure system depicted in EP 1 426 190 B1 by changing the focal depth, or focal plane, of the optical system between the scan sweeps once the laser beams reaches the end of a swath to be scanned. The technology disclosed may thereby provide for an extended total focus range enabling the system to pattern features in the workpiece, e.g. embedded dies, that causes large topography steps that usually are smaller than the scan width of the exposure system and to average out irregularities that can be present across the scanning widths, or scanning lines, of the different scans of the exposure system.

In some implementations the technology disclosed includes exposing to form spots onto workpiece using binary micromirrors of a DMD-based writer. The writing head (with the source array and/or the projection optics), or the substrate, or both can be physically moving to create a relative motion. In addition, the image of the source array can be scanned by optical means, e.g., by a galvanometer or polygon. With either light or particle optics (e.g., electron beam optics) the relative motion of the substrate can be continuous and frozen by a short exposure time. The relative motion can be stepped. Or, exposing beams can track motion of the substrate over a finite distance. In any of these cases, the exposure of spots can be simultaneous or distributed in time, in which case the effect of timing and movement on the placement of the spots on the substrate has to be accounted for.

Different schemes to fill an area with images of isolated spots have been described. One approach is to use several rows of sources across the scanning direction and stagger the elements. In the case of a light source and a modulator per element in the array, the light source may be continuous or quasi-continuous, e.g., a high frequency pulsed laser that emits pulses close enough to be considered continuous. The stage is scanned with a low enough speed to let a modulator change state once per pixel in the grid on the workpiece. In recent patents by IMS Nanofabrication (U.S. Pat. No. 7,084,411 B2 and others) additional rows are added to provide redundancy for bad elements in the array. More elements are added in the same column and small-range scanning is used to let an element write only some pixels in the column on the workpiece to circumvent the speed limitation imposed by the highest practical switching speed of the modulator elements, here blankers in a massively parallel particle beam writer.

As alternative writing platforms and features, Mark Davidson proposed in a paper in 1996 (Proc. SPIE, Vol. 3048, pp. 346-355) to rotate the array slightly so that each row in a 2D array traces a separate column. The light source was again continuous and the pixels were defined by switching the state of the modulators. Kenneth Johnsson described a system (U.S. Pat. No. 6,133,986) with slanted spots in 1996, as did Ted Whitney several years before (U.S. RE 33,931). DNS has taken the scheme of Davidson one step further, see e.g. U.S. Pat. No. 6,903,798. Gilad Almogy, of Applied Materials, has used a simple 2D interlace scheme in order to put every pixel non-adjacent to the last one, thereby avoiding the effect of heating of adjacent pixels, see e.g. (U.S. Pat. No. 6,897,941). Ball Semiconductors gave the mathematics of the slanted scheme in 2004 (US2004/0004699), and ASML discussed using hexagonal grids in U.S. Pat. No. 7,230,677.

A complex 2D interlace platform that can benefit from the use of multiple focal planes scans sparse 2D point arrays or grids across the surface of a workpiece, e.g., multiple optical, electron or particle beams modulated in parallel, as illustrated in US Pat. Pub. US 2010/012743 (May 27, 2010), entitled "Image Reading And Writing Using a Complex Two-Dimensional Interlace Scheme", which has issued as U.S. Pat. No. 8,351,020. The effect of writing with a sparse grid is partially illustrated by FIGS. 14A-C, which are taken from the '020 patent. The scanning and repeated writing creates a dense pixel or spot grid on the workpiece. The grid may be created by various arrays: arrays of light sources, e.g., laser or LED arrays, by lenslet arrays where each lenslet has its own modulator, by aperture plates for particle beams, or arrays of near-field emitters or mechanical probes. For reading systems, the point grid may be created by a sparse point matrix illumination and/or a detector array where each detector element sees only one isolated spot. The idea behind the use of large arrays is to improve throughput. However, the throughput does not scale with the array size, since above a certain size of arrays, previously known schemes fall into their own tracks and start repeating the same data over and over again. The complex two dimensional interlace application discloses methods to scan workpieces with large arrays while preserving the scaling of throughput proportional to array size, even for very large arrays, in fact, essentially without limits. Advantages in some implementations of the disclosed methods include greater flexibility in the choice of array size, workpiece grid, and stage parameters, and a dissolution of hardware signatures in the image, leading to a more ideal image in certain respects than with prior art. More details of this approach are given in US Pat. Pub. US 2010/012743 (May 27, 2010), entitled "Image Reading And Writing Using a Complex Two-Dimensional Interlace Scheme", which has issued as U.S. Pat. No. 8,351,020.

Figure 14C:
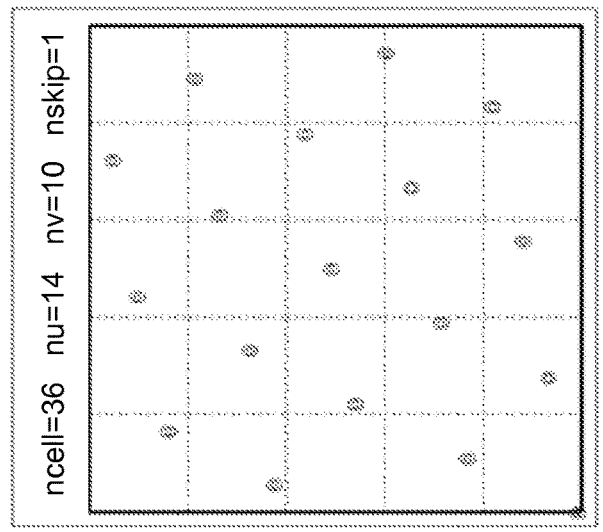
FIGS. 14A-C illustrate how varying parameters for a translation vector can produce a variety of patterns in which successive exposure spots contribute to the overall, cumulative exposure of an area. These figures are reproduced from US Pat. Pub. US 2010/012743 (May 27, 2010), entitled "Image Reading And Writing Using a Complex Two-Dimensional Interlace Scheme", which has issued as U.S. Pat. No. 8,351,020.
Figure 14B:
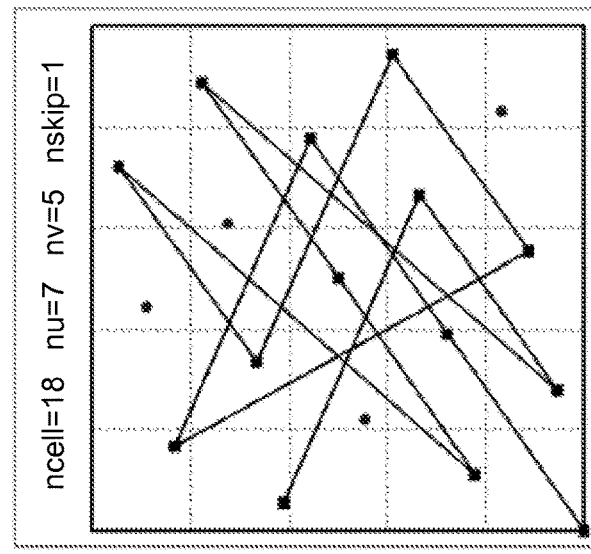
Figure 14A:
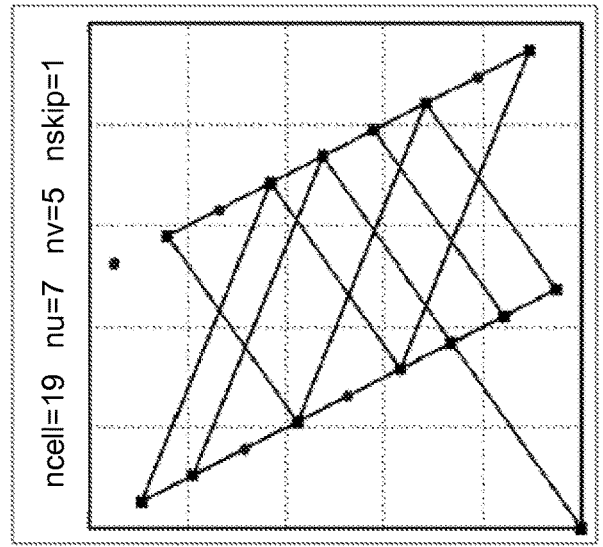

FIGS. 14A-C illustrate how varying parameters for a translation vector can produce a variety of patterns in which successive exposure spots contribute to the overall, cumulative exposure of an area. The writing of spots in the unit cells can be changed by varying the interlace parameters. The same parameters can be chose to cause the points to be written a variable number of times, as explained in the '020 patent.

The technology disclosed, which uses interlaced scans with different focal planes, or focus depths, can be applied to complex interleaving, particularly when spots within an area or cell are exposed two or more times. The complex interlacing pattern uses a repeating pattern. The focal plane can be adjusted at the end of a repeat cycle. Then, overstriking exposures will be at a different focal depth than the preceding exposures. Many complex interlacing schemes, with analysis, could be divided into exposing subcycles that are shorter than a full repeat cycle. The exposure focus could be changed between subcycles.

Figure 6B:
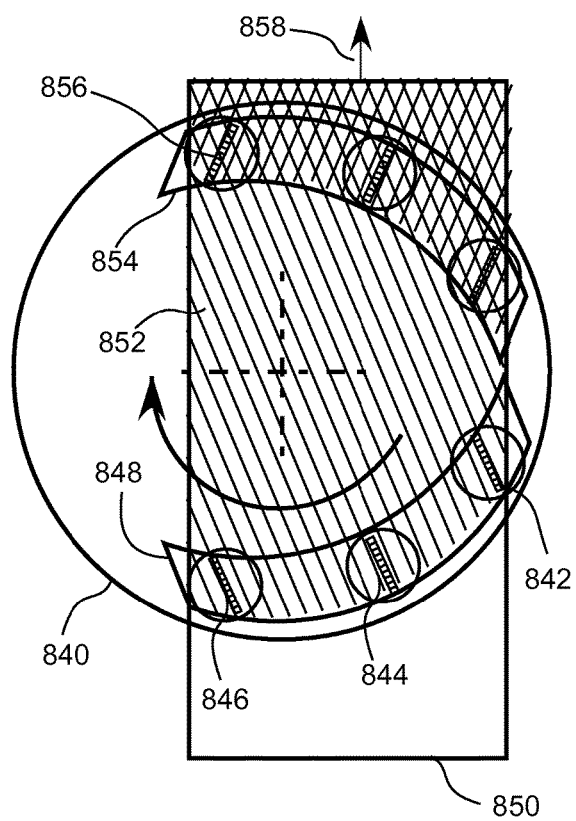

Yet another platform is illustrated in FIGS. 6A-B. The technology disclosed, which uses interlaced scans with different focal planes, or focus depths, to extend the total focus range, or depth of focus (DoF,) may be implemented in a DMD-based writer using one or a plurality of DMDs, e.g. slanted DMDs, by changing the focal depth, or focal plane, of the optical system between the scan paths once the laser beams reaches the end of a swath to be scanned. In certain embodiments of an implementation in a DMD-based writer, adjoining optical (writer) systems associated with adjoining (slanted) DMDs (writing unit) may have different focal planes, or depths, and the scans from adjoining DMDs are interlaced to extend the total focus range (depth of focus) to be able to pattern features in the workpiece, e.g. embedded dies, that causes large topography steps that usually are smaller than the scan width of the exposure system and to average out other irregularities that can be present across the scan widths, or scanning lines, of the different scans of the exposure system.

In some implementations, the technology disclosed may include an interlaced direct writing onto a substrate focused on two or more focal planes at different heights. By interlaced, we mean that exposing radiation focused at the first focal plane alternates with exposing radiation focused at the second focal plane in overlapping exposures of the workpiece. For instance, with rotating arms that expose overlapping strips of the substrate, one arm could be focused at the first focal plane and the next arm focused at the second focal plane. The first focal plane could be at or near the base of an embedded device and the second focal plane at or near the top of the embedded device.

A contoured layer of radiation sensitive material, such as resist, could overlay both a lower profile substrate and a higher profile embedded device formed on the substrate. The difference in height between the first and second focal planes could exceed the effective depth of focus of a patterning beam. This difference in height could be great enough that choosing an intermediate, compromise focal plane would sacrifice precision in patterning at the first or second focal plane or in exposing both portions of the resist overlaying the lower substrate and portions overlaying the higher embedded device. Of course, in some applications, the lower level will be a trench prepared for formation of an embedded device and the higher level will be the general field of the substrate. To generalize, we refer to first and second focal planes, without dependence on the substrate features that account for the different heights and corresponding focal planes. With a difference in height that exceeds the effective depth of focus of the patterning beam, the disclosed technology for interlaced writing to different focal planes accommodates the unevenness of the substrate and radiation sensitive overlay being exposed.

Interlaced direct writing avoids issues of alignment and resists activation time associated with writing a first pass over all or substantial parts of the substrate followed by writing second and sometimes subsequent passes over the substrate. Writing is simplified. With interlaced writing, exposing an area with radiation focused at a first focal plane is completed at about the same time as exposing the same area with radiation focused at the second focal plane.

Direct writing can involve a swept beam or other exposing mechanism or overlapping stamps. Examples of machines that use a swept beam are assignee's Laser Direct Imaging (LDI) writer with rotating arms; Orbotech's polygon scanner system; and Fuji's and Hitachi's multi-parallel-DMD writing systems. In patent applications, the Assignee of this application has describe an alternative LDI configuration that would use overlapping stamps, much as the Assignee's commercially available Sigma™ systems use overlapping stamps.

In one pass writing with two focal planes, the interlaced writing fields overlap by more than fifty percent. The first fifty percent of overlap accommodates the two focal planes. An additional margin of overlap provides a butting or overlap area for blending writing in one stripe or strip with writing in a successive stripe or strip.

Multiple modulators can readily be employed with the technology disclosed. The modulators can be any of the modulators identified above or depicted in the figures, including DMDs, SLMs and AOMs. With multiple modulators, modulated beams with different focal depths or focused on different focal planes can readily be implemented. Typically, multiple beams can be focused through different optical elements to produce different focal depths. Even beams that share parts of a common optical path can enter the path with different optical characteristics that result in different optical properties. Alternatively, different beams can be relayed to a workpiece along different optical paths.

FIGS. 5 and 6A-B illustrate implementations of multiple modulators, such as modulators having 8192 elements each. While four modulators are illustrated, six or eight modulators could be used. Or, any number of modulars from two to 32 modulators, inclusive, could be used. FIG. 5, to the left 510, depicts use of multiple modulators for single exposure in a single stripe or strip of printing. In this configuration, interlaced multi-focus writing would be accomplished by overlapping stripes. Multiple focus depths could be implemented by focusing horizontally adjacent modulators or pairs of horizontally adjacent modulators on different focal planes. With four modulators and different focal planes for adjacent modulators, interleaved passes could overlap by about 25 or 75 percent, so that consecutive passes would focus on the different focal planes. With different focal planes for pairs of adjacent modulators, interleaved passes could overlap by about 50 percent. In other implementations, all of the modulators might be focused to the same focal depth and the focal depth might change between interleaved writing passes. The amount of overlap would depend on the number of writing passes. FIG. 5, to the right 520, depicts use of multiple modulators for double exposure in a singe stripe or strip of printing. Various configurations of focus and overlap can be used, as described for the left hand configuration. For instance, horizontally adjacent modulators would be focused on focal planes at different focal depths. Then, writing of a single strip or stripe would create an exposure at multiple focal depths. FIG. 6A depicts multiple modulators tilted at different angles to the direction in which a stripe or strip is exposed. In this illustration, the different angles are about +/−45 degrees. Angled orientation reduces the difference in exposure bias along X and Y axes of the resulting pattern. Orientations other than 45 degrees, such as any angles from 30 to 60 degrees could be used.

FIG. 6B illustrates how a rotating writer can be used to expose a workpiece on both right to left and left to right portions of a full rotation. In this configuration, each pass of a writing beam presents an opportunity to change the focal plane depth.

The problem of writing on an uneven workpiece coated with a radiation sensitive layer is solved by exposing the uneven workpiece in interlaced writing passes using at least first and second writing beams, wherein the first and second writing beams have first and second focal planes that target higher and lower surfaces of the uneven workpiece.

Some Particular Implementations

In one implementation, a method is described that includes writing on an uneven workpiece covered with a radiation sensitive layer. This method includes exposing the uneven workpiece in interlaced writing passes using at least first and second writing beams. The first and second writing beams can have first and second focal planes that target higher and lower surfaces of the uneven workpiece. For instance, one focal plane can correspond to a field of the uneven workpiece and the other focal plane can correspond to a trench that is lower than the field or an embedded device that is higher than the field.

This method and other implementations of the technology disclosed can each optionally include one or more of the following features and/or features described in connection with additional methods disclosed. In the interest of conciseness, the combinations of features disclosed in this application are not individually enumerated and are not repeated with each base set of features. The reader will understand how features identified in this section can readily be combined with sets of base features identified as implementations.

The method can further include interlacing the writing passes using writing heads mounted on separate arms of a rotating arm-writing platform. Some implementations include inducing the different focal planes of the first and second writing beams using optical components positioned in separate optical paths traversed by the writing beams. Other implementations include inducing the different focal planes of the first and second writing beams using optical components positioned in a common optical path traversed by the writing beams. For instance a reflective adaptive optical device can be positioned in the common optical path to control heights of the focal planes.

The method can include using separate modulators to modulate the first and second writing beams. Or, using a single modulator to modulate the first and second writing beams. When using a single modulator, the duty cycle of the modulator can alternate among modulations for the different focal planes.

In some applications, a difference in height between the higher and the lower surfaces is greater than the effective focal depth of the first and second writing beams. For instance, assignee's LDI™ platform has: wavelengths of 355 nm or 405 nm (more generally in the range of 300 to 450 nm); resolution of 10 micrometer (in the range of 5 to 12 micrometers); depth of focus for one writing head (exposure) of about 80 micrometers (in the range of 50 to 150 micrometers). Applying the technology disclosed, an expanded total depth of focus can be achieved by using multiple focal planes of about 150 micrometers (in the range of 100 to 300 micrometers depending on the DoF for one writing head and the number of writing heads with different focus levels used.) Applied to embedded substrates, the thickness of a thick die or component, placed (e.g. by a pick-and-place tool) in an embedded structure patterned by an LDI tool may be 150 micrometers (in the range of 30 to 200 micrometers.)

In some implementations, the first and second writing beams are laser beams at different frequencies. These implementations can further include separately modulating the first and second writing beams; and directing the first and second writing beams through an optical train that produces different focal planes due to the different frequencies. Some implementations using writing beams at different frequencies use a single laser source generating two frequencies of laser radiation; and separate the frequencies of radiation to form the first and second writing beams.

In some implementations, the interlaced writing passes overlap an instance of the first writing beam with a consecutive instance of the second writing beam by at least 25 percent of a writing width of the first writing beam.

In some implementations, the first and second writing beams are swept across the uneven workpiece. In other implementations, the first and second writing beams are flashed onto the uneven workpiece.

The forgoing method claims can be restated as corresponding device or method claims. In some implementations, a system is disclosed that exposes a radiation sensitive layer on an uneven workpiece. This system includes one or more laser sources that generate at least first and second writing beams, one or more optics that project the first and second writing beams onto the uneven workpiece with first and second focal planes of the respective writing beams that target higher and lower surfaces of the uneven workpiece, and one or more controllers that interlace writing passes consecutively exposed by the first and second writing beams on overlapping areas of the uneven workpiece.

This method and other implementations of the technology disclosed can each optionally include one or more of the following features and/or features described in connection with additional methods disclosed.

In some implementations, the system further includes a rotating arm-writing platform with writing heads mounted on separate arms, wherein the first and second writing beams are projected along alternating writing arms.

Some implementations include first and second optical paths respectively traversed by the first and second writing beams and these first and second optical paths induce the first and second focal planes. Other implementations include a common optical path for the first and second writing beams and at least one optical component positioned on the common optical path that induces the first and second focal planes. This optical component can be a reflective adaptive optical device.

Some system implementations further include two or more separate modulators that modulate the first and second writing beams. Others include using one or more common modulators that modulate the first and second writing beams.

In some applications, a difference in height between the higher and the lower surfaces is greater than an effective focal depth of the first and second writing beams.

Some implementations use first and second writing beams are laser beams at different frequencies. Those implementations can further include two or more modulators that modulate the first and second writing beams; and a common optical train traversed by the first and second writing beams that produces different focal planes due to the different frequencies.

Some systems use a single laser source that generates two frequencies of laser radiation; and a beam separator that separates the frequencies of radiation into the first and second writing beams.

Some systems are configured such that the interlaced writing passes overlap an instance of the first writing beam with a consecutive instance of the second writing beam by at least 25 percent of a writing width of the first writing beam. Others overlap by at least 50 percent.

In some systems, the first and second writing beams are swept across the uneven workpiece. In others, the first and second writing beams are flashed onto the uneven workpiece.

Other implementations may include a non-transitory computer readable storage medium storing instructions executable by a processor to perform a method as described above. Yet another implementation may include a system including memory and one or more processors operable to execute instructions, stored in the memory, to perform a method as described above.

Embedded Die Applications:

In recent development of manufacturing methods in this field the interest for embedded dies technologies and wafer level packaging technologies has increased due to expected advantages in cost and performance. Although these are referred to as different technologies they both involve the embedding of dies and related problems.

In this development of manufacturing integrated circuits and other products involving patterning of layers there are however various factors that affect the productivity. The placing of dies and alignment of patterns are important factors that are decisive for the overall yield in the manufacturing process using these technologies. For example, in wafer level packaging the fan-out process comprises stages that are limiting to productivity.

General Description of Fan-Out Process

For example in the manufacturing of printed circuit boards with integrated circuits, a plurality of dies in the form of small blocks of semiconducting material each having a functional electronic circuit are distributed on a printed circuit board workpiece, e.g. in the form of a carrier silicon wafer. The dies are then covered with further layers of material to form the integrated circuit in a series of manufacturing steps. In the course of the manufacturing process patterns are generated on selected layers of the workpiece in one or a plurality of patterning steps.

Pattern Generation

Patterns are generated on a layer of a workpiece, e.g. for the purpose of forming an electric circuit pattern generated in order to couple connection points or contact pads of components such as dies in a desired electric circuit. The expression die is herein used as common expression for any electronic component such as a passive component, an active component, or any other component associated with electronics. Such a pattern is generated in a writing or printing process in which an image of a circuit pattern is projected, e.g. written or printed on a surface layer covering a conductive layer on the workpiece.

Placing of Dies on Workpiece

Prior art patterning systems require workpieces with dies placed very accurately on the workpiece to be able to align patterns to the dies. This is due to the fact that prior art patterning systems use steppers and aligners that have limited capabilities to perform alignment to individual dies without significantly slowing down the patterning process with the consequence that current requirements on the takt time that sets the pace for the process of manufacturing products comprising patterned layers cannot be met. In prior art, the dies are accurately placed on the workpiece, further including the fastening of the dies by eutectic bonding or glue onto the workpiece, which is a very time consuming process.

Placing of Dies on Workpiece by Pick-and-Place Machine

There is a desire in the industry to distribute the dies on the workpiece by means of a pick-and-place machine in order to increase the production rate. However, present day pick-and-place machines cannot keep the speed required by the takt time of the manufacturing process, while maintaining the placement accuracy that is required by prior art pattern generators to manage alignment. Dies placed by means of state of the art pick-and-place machines may be regarded to have almost random positional errors.

Fan Out Process

The fan out process is an example of a process that includes arranging conductive paths for connecting to connection points of dies on a workpiece. A redistribution layer covering the dies is provided with a circuit pattern that is aligned with the dies and connected to contact pads for example with solder balls deposited on the redistribution layer and extending to an another layer in a vertical electrical connection by an aperture that in short is called a via, for vertical interconnect access between conductors in different layers. Alignment between layers is an important factor in the fan-out process and prior art conventional fan-out processes for inaccurately placed dies are not cost effective due to the poor performance of alignment to individual dies in prior art patterning systems. FIG. 1 shows schematically an example of embedded dies in a prior art process description of a fan-out wafer level packaging process. This process is further described in the detailed description below.

We claim as follows:

1. A method of direct writing on an uneven surface of a workpiece, the method comprising:
    performing laser energy pattern imaging on the uneven surface of the workpiece, which is covered with a radiation sensitive layer that produces the uneven surface and is moving in relationship to a writing head, by exposing the uneven surface using at least two laser energy exposures in direct writing operations at a particular point on the workpiece to form a pattern in the radiation sensitive layer,
    wherein a first height of a first focal plane of a first laser energy exposure at the particular point on the workpiece of the at least two laser energy exposures is different from a second height of a second focal plane of a second laser energy exposure at the particular point on the workpiece of the at least two laser energy exposures, such that the first laser energy exposure at the particular point on the workpiece and the second laser energy exposure at the particular point on the workpiece form an extended total depth of focus at the particular point on the workpiece.

2. The method of claim 1, wherein the direct writing to the uneven surface is performed in one sequence of exposures of the workpiece by moving a workpiece area to be exposed in one direction over an exposure area of a direct writing tool by one of a continuous movement or a step-wise movement in discrete steps.

3. The method of claim 1, further including interlacing the at least two laser energy exposures by using writing heads mounted on separate arms of a rotating arm-writing platform.

4. The method of claim 1, further including inducing the first height of the first focal plane and the second height of the second focal plane using optical components positioned in separate optical paths traversed by first and second writing beams that produce the first laser energy exposure and the second laser energy exposure.

5. The method of claim 1, further including inducing the first height of the first focal plane and the second height of the second focal plane using optical components positioned in a common optical path traversed by first and second writing beams that produce the first laser energy exposure and the second laser energy exposure.

6. The method of claim 5, wherein a reflective adaptive optical device is positioned in the common optical path to control the first height of the first focal plane and the second height of the second focal plane.

7. The method of claim 4, further including using separate modulators to modulate the first and second writing beams.

8. The method of claim 5, further including using a single modulator to modulate the first and second writing beams.

9. The method of claim 4, wherein a difference in height between higher and lower surfaces of the uneven surface is greater than an effective focal depth of either of the first and second writing beams used in the direct writing operations.

10. The method of claim 7,
wherein the first and second writing beams are laser beams at different frequencies, and
wherein the method further includes:
    separately modulating the first and second writing beams; and
    directing the first and second writing beams through an optical train that produces different focal planes due to the different frequencies.

11. The method of claim 10, further including:
generating, by a single laser source, two frequencies of laser radiation; and
separating the two frequencies of laser radiation to form the first and second writing beams.

12. The method of claim 10, wherein interlaced writing passes overlap by at least 25 percent of a writing width of at least one of the first and second writing beams.

13. The method of claim 12, wherein the first and second writing beams are swept across the uneven surface of the workpiece.

14. The method of claim 12, wherein the first and second writing beams are flashed onto the uneven surface of the workpiece.

15. A method of direct writing a pattern to a workpiece, the method comprising:
performing laser energy pattern imaging on the uneven surface of the workpiece, which is covered with a radiation sensitive layer that produces the uneven surface and is moving in relationship to a writing head of an optical system, by:
exposing a particular point of the uneven surface of the workpiece to a first laser energy exposure by a direct writing operation utilizing the optical system to form a pattern in the radiation sensitive layer, the first laser energy exposure being at a first height of a first focal plane; and
exposing the particular point of the uneven surface of the workpiece to a second laser energy exposure by the direct writing operation utilizing the optical system, the second laser energy exposure being at a second height of a second focal plane,
wherein the first height of the first focal plane of the first laser energy exposure at the particular point on the workpiece is different from the second height of the second focal plane of the second laser energy exposure at the particular point on the workpiece, such that the first laser energy exposure at the particular point on the workpiece and the second laser energy exposure at the particular point on the workpiece form an extended total depth of focus at the particular point on the workpiece.

* * * * *

UNITED STATES PATENT AND TRADEMARK OFFICE
CERTIFICATE OF CORRECTION

PATENT NO. : 10,149,390 B2
APPLICATION NO. : 14/011725
DATED : December 4, 2018
INVENTOR(S) : Per Askebjer et al.

Page 1 of 1

It is certified that error appears in the above-identified patent and that said Letters Patent is hereby corrected as shown below:

In the Claims

In Claim 15, at Column 22, Line 1, after "workpiece" insert --including an uneven surface--.

Signed and Sealed this
Fifth Day of March, 2019

Andrei Iancu
*Director of the United States Patent and Trademark Office*